(12) United States Patent
Liu

(10) Patent No.: US 11,296,179 B2
(45) Date of Patent: Apr. 5, 2022

(54) FLAT PANEL DEVICE ELECTRODE STRUCTURE AND METHOD OF MANUFACTURING THE SAME

(71) Applicant: V-Finity International, George Town (KY)

(72) Inventor: Heng Liu, Sunnyvale, CA (US)

(73) Assignee: V-Finity International, George Town (KY)

( * ) Notice: Subject to any disclaimer, the term of this patent is extended or adjusted under 35 U.S.C. 154(b) by 0 days.

(21) Appl. No.: 16/944,680

(22) Filed: Jul. 31, 2020

(65) Prior Publication Data
US 2021/0066438 A1 Mar. 4, 2021

Related U.S. Application Data

(60) Provisional application No. 62/891,708, filed on Aug. 26, 2019.

(51) Int. Cl.
*H01L 29/08* (2006.01)
*H01L 27/32* (2006.01)
*H01L 51/52* (2006.01)
*H01L 51/56* (2006.01)
*G09G 3/3216* (2016.01)
*H01L 51/50* (2006.01)

(52) U.S. Cl.
CPC ....... *H01L 27/3276* (2013.01); *G09G 3/3216* (2013.01); *H01L 51/502* (2013.01); *H01L 51/5206* (2013.01); *H01L 51/5221* (2013.01); *H01L 51/56* (2013.01); *H01L 2227/323* (2013.01)

(58) Field of Classification Search
CPC ............ H01L 27/3276; H01L 51/5206; H01L 51/5221; G09G 3/3216
See application file for complete search history.

(56) References Cited

U.S. PATENT DOCUMENTS

| | | |
|---|---|---|
| 2004/0207315 A1 | 10/2004 | Robbie et al. |
| 2006/0050032 A1 | 3/2006 | Gunner et al. |
| 2013/0314883 A1 | 11/2013 | Ling |
| 2016/0350052 A1 | 12/2016 | Chang |
| 2018/0047927 A1 | 2/2018 | Zhang et al. |
| 2018/0254303 A1* | 9/2018 | Mishima ............. H01L 51/5265 |

OTHER PUBLICATIONS

"International Application Serial No. PCT US2020 044485, International Search Report dated Oct. 15, 2020", 2 pgs.
"International Application Serial No. PCT US2020 044485, Written Opinion dated Oct. 15, 2020", 4 pgs.

* cited by examiner

*Primary Examiner* — Phuc T Dang
(74) *Attorney, Agent, or Firm* — Schwegman Lundberg & Woessner, P.A.

(57) ABSTRACT

A flat panel device, such as a flat display, comprises a substrate; a power circuit; a plurality of pixel circuits, each pixel circuit coupled to a self-emitting device; and a plurality of power lines electrically coupled to the plurality of pixel circuits. The plurality of power lines are also electrically coupled to the power circuit by a plurality of vias traveling through the substrate.

20 Claims, 8 Drawing Sheets

FLAT PANEL DEVICE ELECTRODE STRUCTURE AND METHOD OF MANUFACTURING THE SAME

CROSS REFERENCE TO RELATED APPLICATIONS

This application claims priority to and incorporates by reference U.S. patent application No. 62/891,708 filed Aug. 26, 2019.

TECHNICAL FIELD

The present disclosure generally relates to flat panel displays and more particularly, but not exclusively, to providing a flat panel device, such as a display, with an electrode structure enabling current supply through an array substrate with vias.

BACKGROUND

Demand for larger and high-performance displays at affordable prices for both consumer, commercial, and industrial applications have been increasing. In the past year Liquid Crystal Displays (LCDs) with 8K resolution and 120" diagonal in size was made available in the market. While Organic Light Emitting Diode (OLED) displays with more than 80" are also becoming popular. LCD and OLED displays have been the mainstream display technologies for low cost displays in the sub-100" market. At the same time projection technology seems to be the best choice for low cost >100" applications. In the higher end premium market, narrow pixel pitch LED display has found great adoption in the very large format display segment. OLED display with self-emitting pixels can be operated at fully turned off mode at any given pixel that produces the ultimate black level that is superior over the LCD counterpart. However, unlike LCD, pixels of an OLED display require electrical current to light them up. When the number of pixels increases with higher resolution and the distance between the power feed and the furthest pixels increases with larger panel size, the loading of the power delivery also increases. This results in higher power loss and heat generation in the panel. Since OLEDs are made out of organic materials, the reliability can be heavily impacted by the operating temperatures. Also, it is well known that reliable electrical contacts to the OLED devices has been a technical challenge and it remains an issue even today. At higher temperatures, the ohmic contacts of OLED devices tend to fail prematurely. Therefore, the performance such as display brightness, resolution and sizes are limited or need to be traded off with production yield for OLED display.

SUMMARY

In an embodiment, a flat panel device, comprises a substrate; a power circuit; at least one pixel circuit, at least one of the pixel circuits coupled to a self-emitting device; and at least one power line electrically coupled to the at least one pixel circuit. The at least one power line is also electrically coupled to the power circuit by at least one via traveling through the substrate.

In an embodiment, a method of manufacturing the flat panel device comprises providing the substrate; placing the pixel circuit on a first surface of the array substrate; connecting the pixel circuit to the self-emitting devices; laying the power line on the first surface electrically coupled to the pixel circuit; creating the via through the substrate electrically coupled to the power line; placing a first interconnecting circuitry on a second surface of the substrate electrically coupled to the via; and bonding the power circuit to the first interconnecting circuitry.

In an embodiment, a method of using the flat panel device comprises powering on the flat panel device; transmitting current from the power circuit through the via to the power line; transmitting current from the power line to the pixel circuit; and causing, by the pixel circuit, the self-emitting device to emit light.

In an embodiment, a flat panel device comprises a substrate, at least an anode line, at least a cathode line; an OLED stack, which is electrically coupled to the at least anode and cathode lines; and a driver circuitry electrically coupled to the at least an anode line and the at least cathode line through a plurality of vias.

BRIEF DESCRIPTION OF THE DRAWINGS

To more easily identify the discussion of any particular element or act, the most significant digit or digits in a reference number refer to the figure ("FIG.") number in which that element or act is first introduced.

DETAILED DESCRIPTION

The description that follows includes systems, methods, techniques, that embody illustrative embodiments of the disclosure. In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

Figure 1:
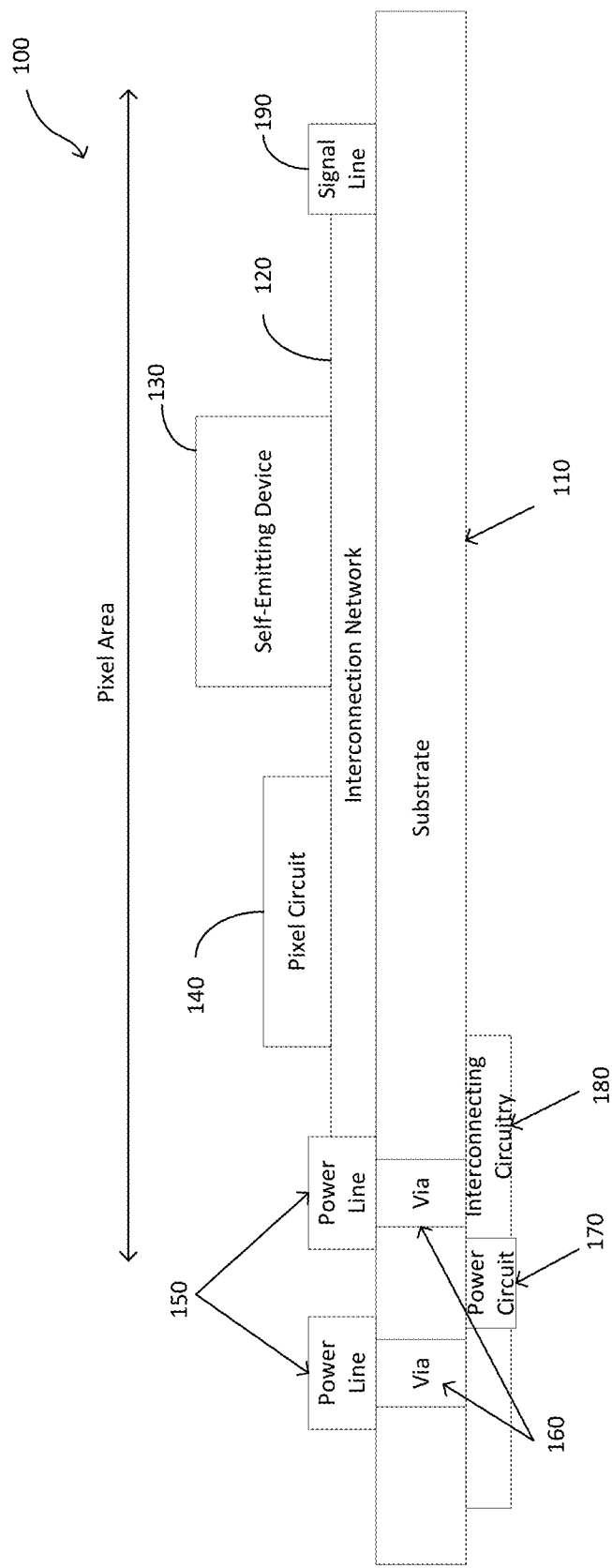
FIG. 1 depicts a cross section of a flat panel device according to an embodiment.

FIG. 1 depicts a cross section of a flat panel device 100 according to an embodiment. The flat panel device 100 comprises an array substrate 110; a power circuit 170; a plurality of pixel circuits 140, each pixel circuit coupled to a self-emitting device 130, such as an organic light emitting diode (OLED) or light emitting diode or other electroluminescent (EL) devices; and a plurality of power lines 150 electrically coupled to the plurality of pixel circuits 130. The plurality of power lines 150 also electrically coupled to the power circuit 170 by a plurality of vias 160 traveling through the array substrate 110. Note for ease of illustration, not all elements of the flat panel device are illustrated, e.g., an encapsulation layer.

In an embodiment, the power circuit is disposed on a first surface of the array substrate and the plurality of power lines are disposed on a second surface of the array substrate. In an embodiment, the device 100 comprises a first plurality of interconnecting circuitry 180 on the first surface electrically coupling the vias 160 to the power circuit 170. The interconnecting circuitry 180 distribute electrical power from the Power Circuit(s) 170.

In an embodiment, the plurality of powers lines 150 are electrically connected to the plurality of pixel circuits 140 through a second plurality of interconnects 120.

Figure 3:
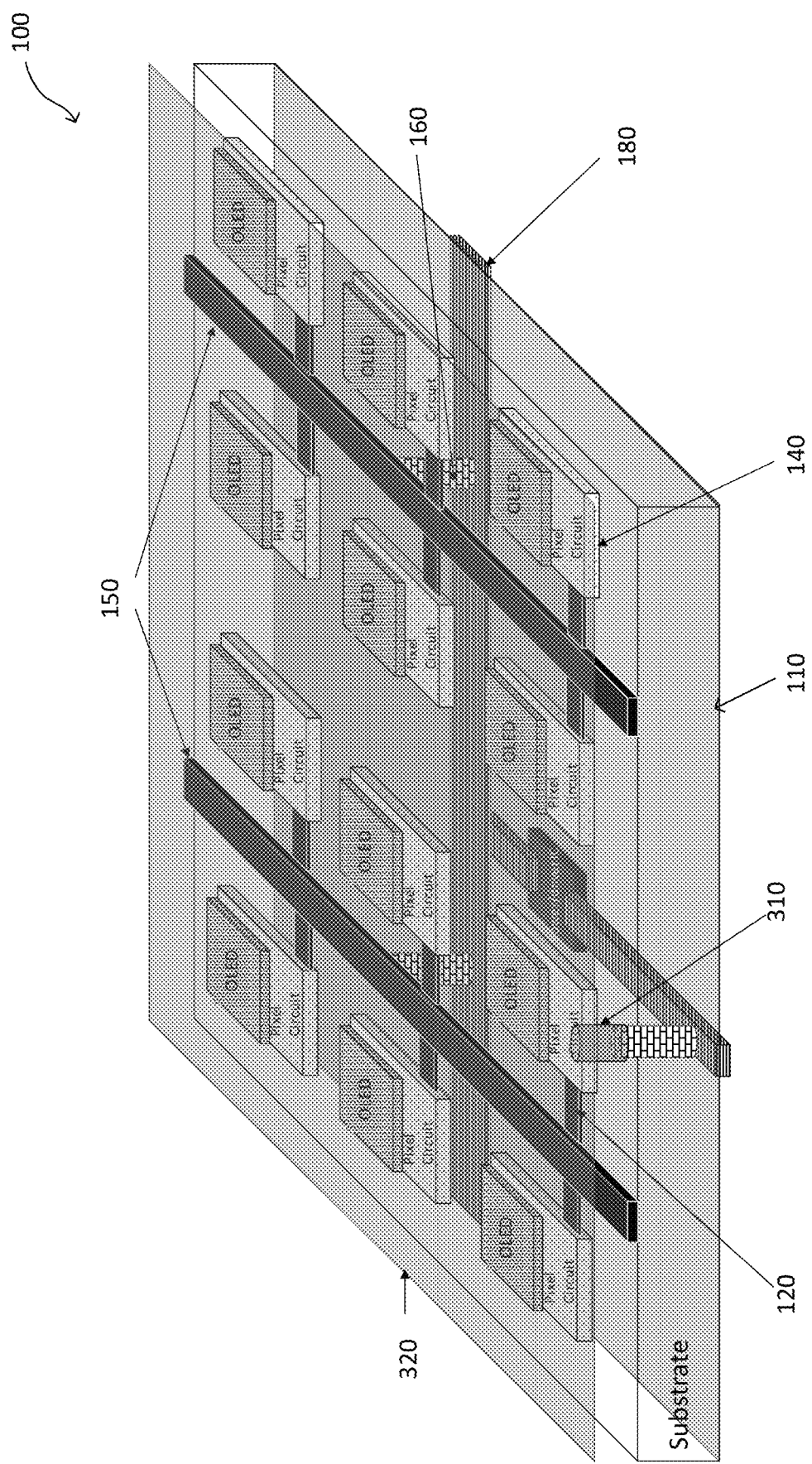
FIG. 3 depicts a perspective view of the flat panel device of FIG. 1.

In an embodiment, the device 100 comprises a common electrode disposed over the self-emitting devices 130 as show in FIG. 3. In another embodiment, the device 100 comprises a common electrode and an anode electrode disposed in-plane on the substrate 110.

The device 100 may also comprise a plurality of signal lines 190 connected to the pixel circuits 140 via the second plurality of interconnects 120. The pixel circuit (e.g., comprising TFTs) 140 process data from signal lines 190 to determine power delivering to the self-emitting device 130.

While the self-emitting device 130 is illustrated a single separate device, is may be part of a sheet of organic light emitting diodes.

The substrate material 100 can be glass, polymer, ceramic, silicon, etc. The vias 160 can be made by laser drilling, laser modification, dry/wet etching, or other mechanical means. The conductive material in the vias 160 can be metal such as Cu, solder, AuSn, Ag-epoxy, or other metal/polymer filler. The backside interconnecting circuitry 180 can be made by photolithographic method and the power circuit 170 can be a driver IC attached by SMD process (pick and place) or a flexible printed circuit (FPC) contains the driver IC and bonded to the first surface of substrate 110. The vias 160 can be made before a TFT array 110 process or after. If the vias 160 are made after the TFT array 110 process where the power lines 150 have been made onto the substrate 110, the via 160 process method should be selected/designed not to damage the already made power lines 150.

Figure 2:
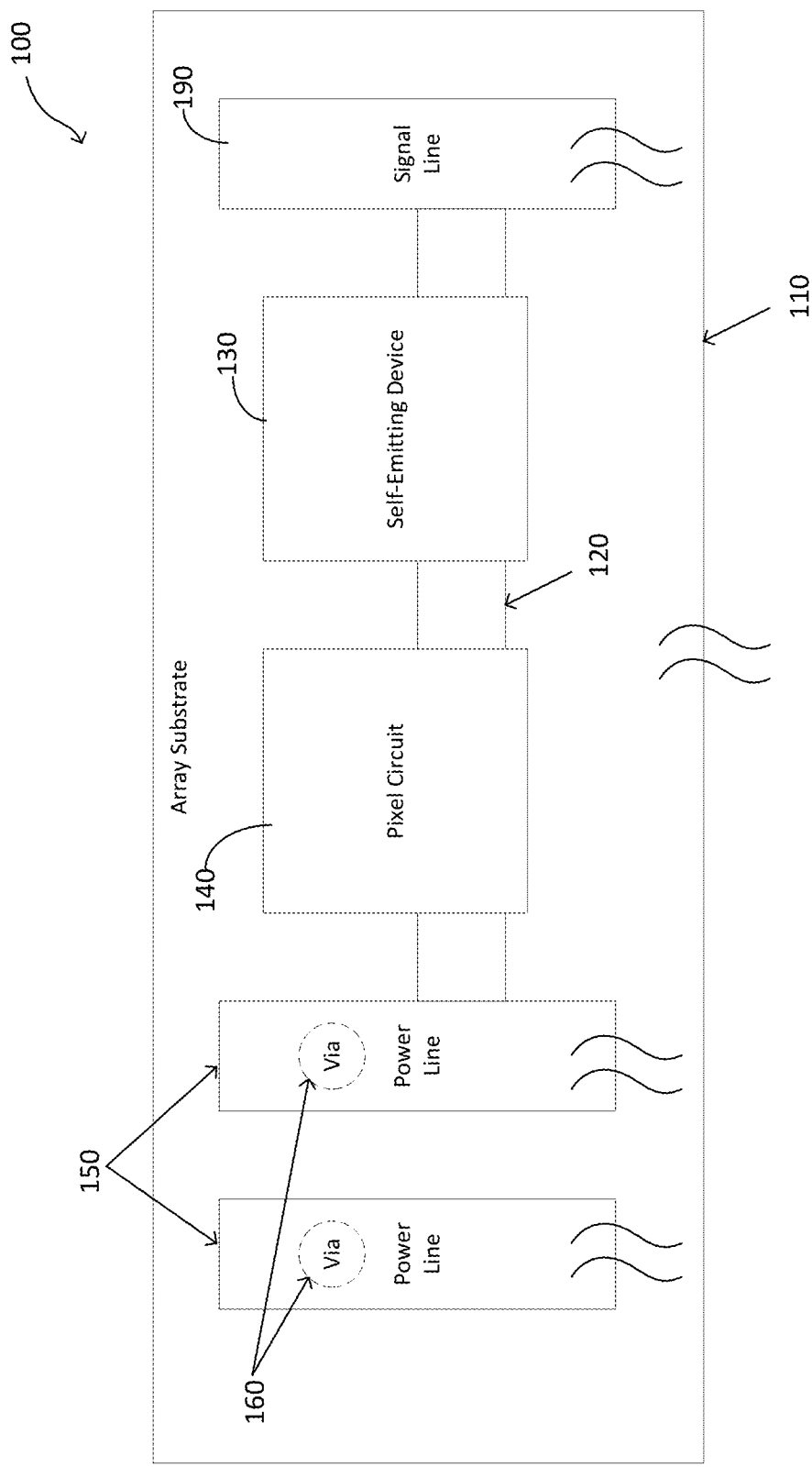
FIG. 2 depicts a top view of the flat panel device of FIG. 1.

FIG. 2 depicts a top view of the flat panel device 100 of FIG. 1. In an embodiment, the pixel circuit 140 and self-emitting device 130 overlay the interconnect 120.

FIG. 3 depicts a perspective view of the flat panel device 100 of FIG. 1. For ease of illustration, the signal lines 190 are not shown. In an embodiment, the device 100 includes a common electrode 320 overlaying the self-emitting devices 130, shown as OLEDs in this figure. Further, in an embodiment, the self-emitting devices 130 can overlay the pixel circuits 140 as shown in FIG. 3 or be placed side-by-side as shown in FIG. 1 and FIG. 2. In an embodiment, the via 160 may include a conductive post or dam 310 connecting the common electrode 320 to the via 160 and bring the common to the back of the substrate interconnecting circuitry 180.

Figure 4:
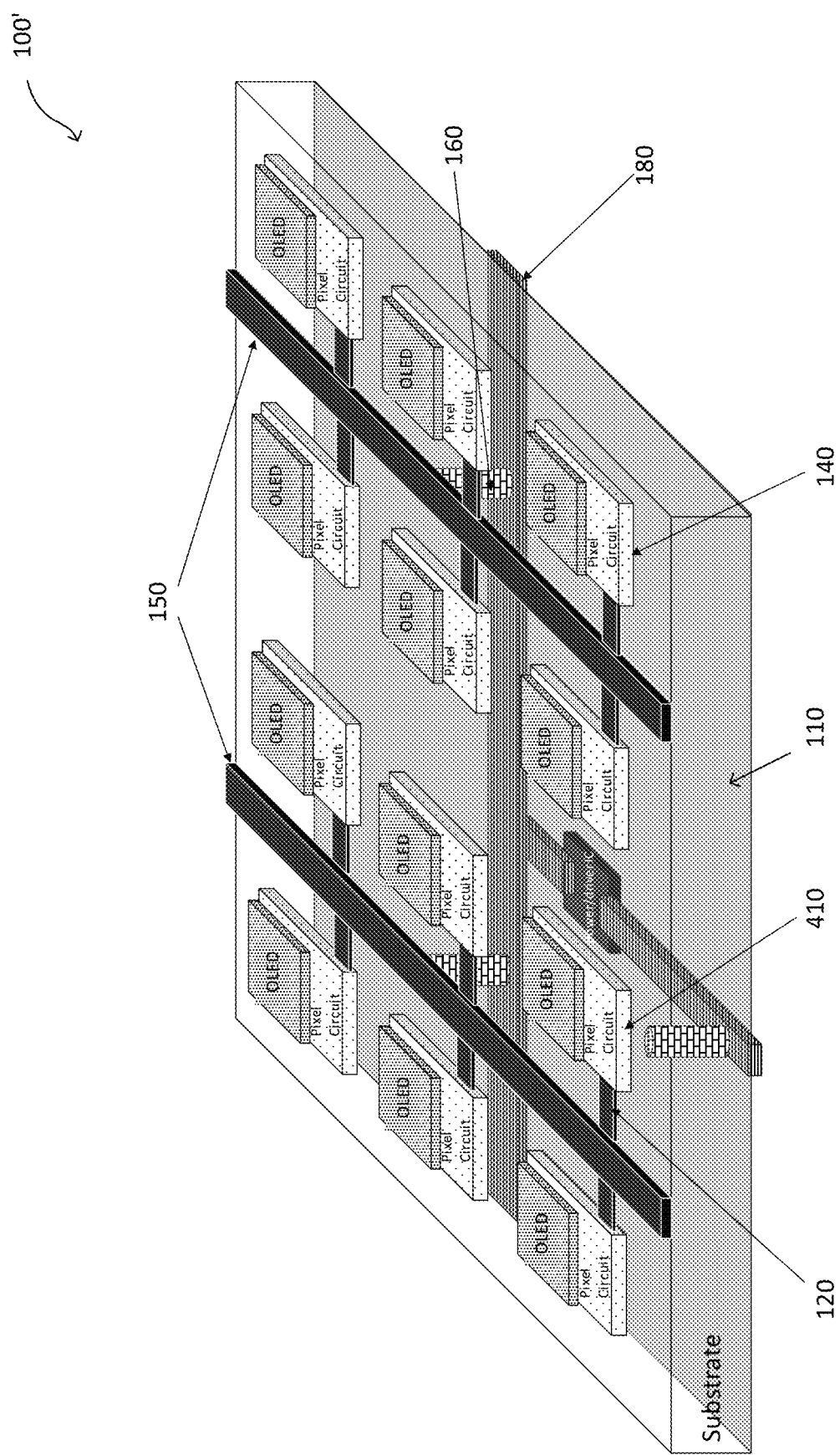
FIG. 4 depicts a perspective of a flat panel device according to an embodiment.

FIG. 4 depicts a perspective of a flat panel device 100' according to an embodiment. The device 100' is substantially similar to the device 100. In the device 100' the common and anode electrodes 410 are made on the same substrate (in-plane) and there is no top electrode 320 needed.

Figure 5:
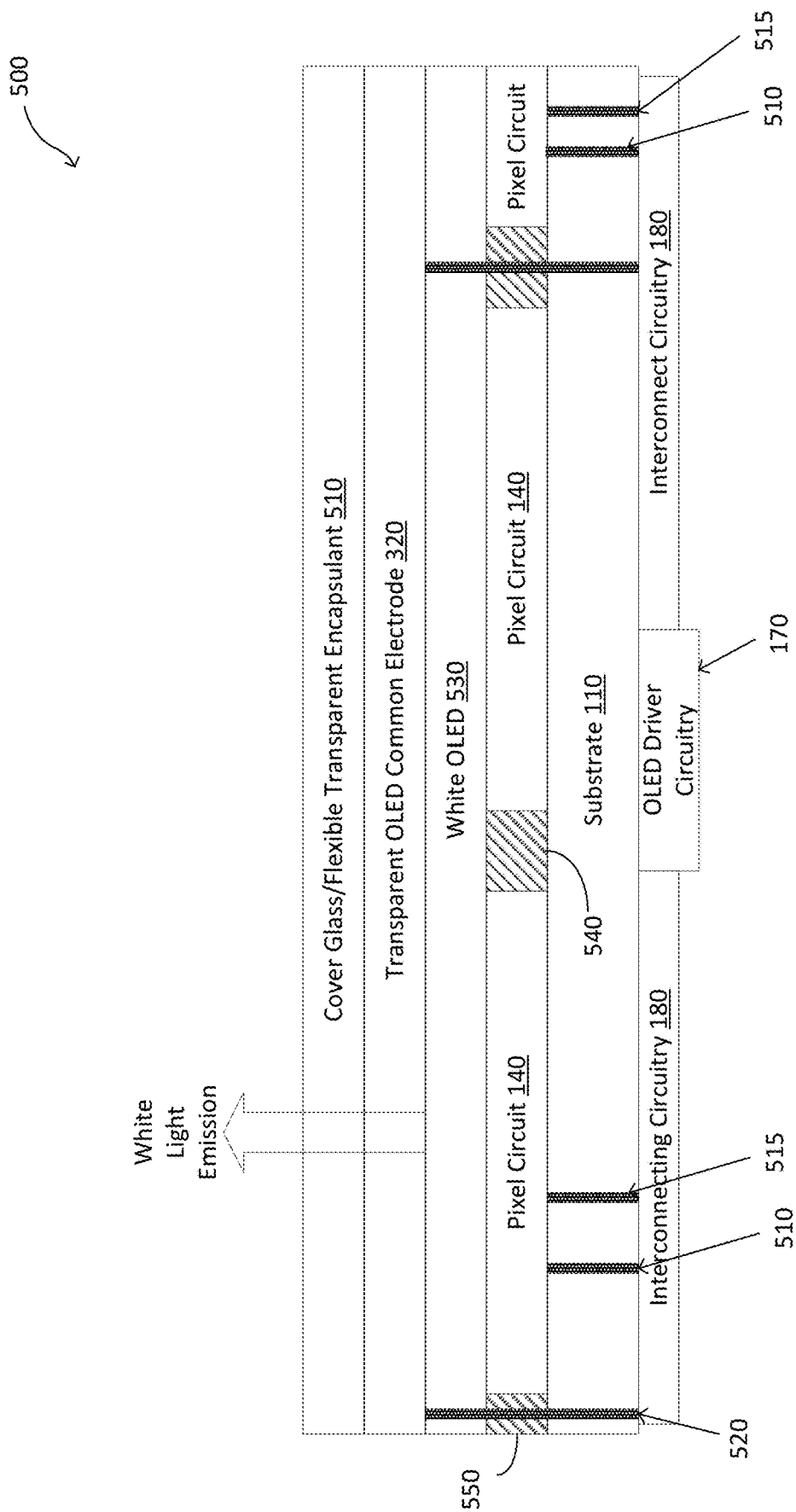
FIG. 5 depicts a cross section of a flat panel device according to an embodiment.

FIG. 5 depicts a cross section of a flat panel device 500 according to an embodiment. Note, for ease of illustration, not all components are illustrated. The device 500 is substantially similar to the device 100 except that self-emitting device comprises a single color. e.g., a white OLED 530. In an embodiment, the device 500 has a first non-emitting space 540 between each pixel circuit 140 and has an edge non-emitting space 550 with a length less than a length of the first non-emitting space 540, e.g., half of the length of the first non-emitting space 540 enabling multiple panels to be assembled without a visible seam. A via 510 connects the pixel circuit 140 to the driver circuitry 170. A second via 520 connects the interconnecting circuitry 180 to the common electrode 320. The second via 520 travels through the substrate 110, edge 520 and/or other non-emitting space or non-pixel circuit 140 space, and OLED 530. An encapsulant 510 is disposed over the electrode 320.

In an embodiment, the pixel circuits 140 can be active matrix, or PWM driven. The White OLED layer 530 can be continuous or patterned. But the lit area is where pixel circuit 140 supplies current. Placing interconnecting circuitry 180 and driver circuitry 170 under non-emitting areas can make device 500 double sided emission. An additional via 515 supplies signals to the pixel circuits 140.

Figure 6:
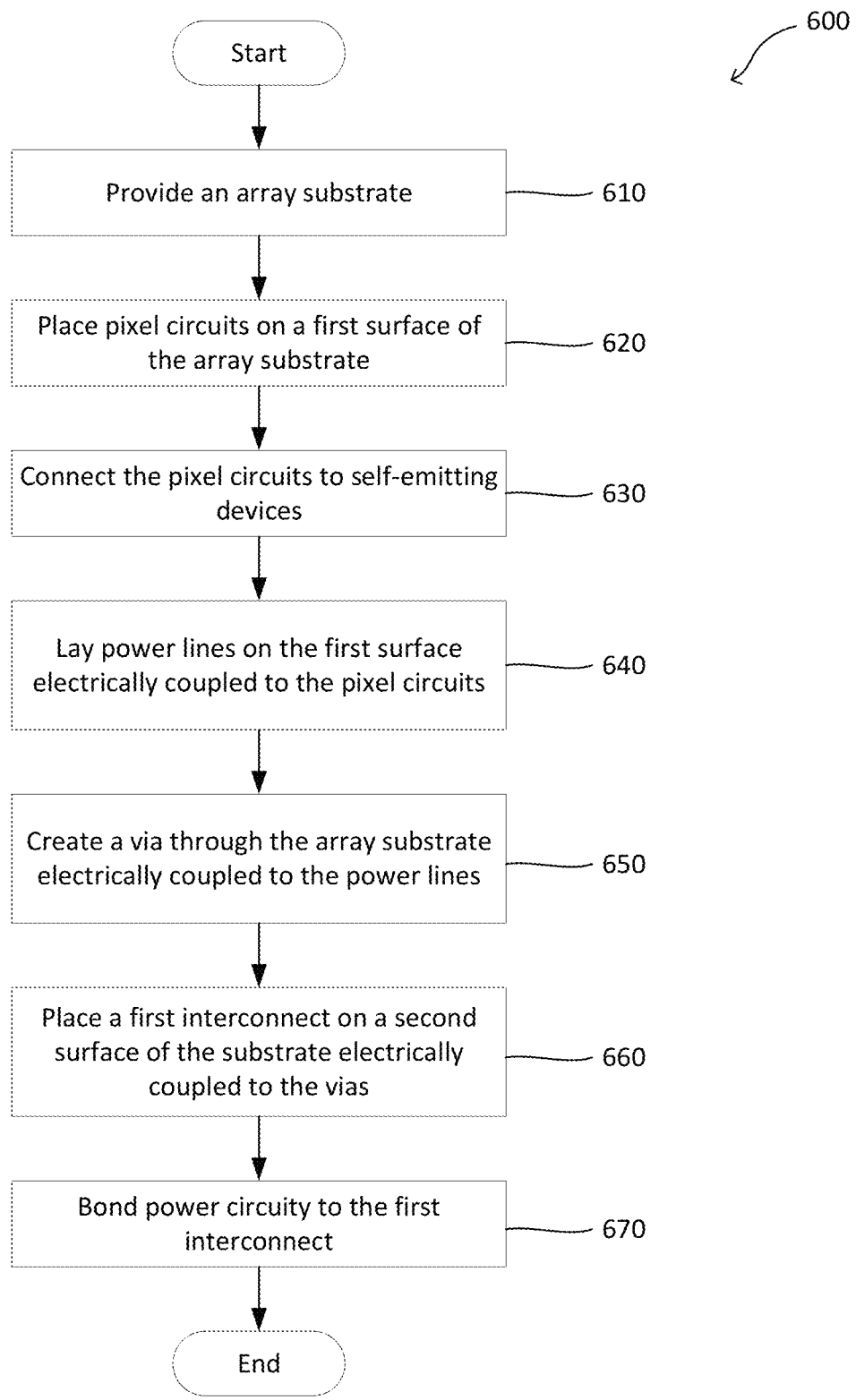
FIG. 6 depicts a flowchart of a method of manufacturing a flat panel device according to an embodiment.

FIG. 6 depicts a flowchart of a method 600 of manufacturing a flat panel device (e.g., device 100, 100', or 500) according to an embodiment. The method 600 comprises providing (610) an array substrate 110; placing (620) pixel circuits 140 on a first surface of the array substrate 110; connecting (630) the pixel circuits 140 to self-emitting devices 130; laying (640) power lines 150 on the first surface electrically coupled to the pixel circuits 140; creating (650) a via 160 through the array substrate 110 electrically coupled to the power lines 150; placing (660) a first interconnecting circuitry 180 on a second surface of the substrate electrically coupled to the vias; and bonding (670) power circuitry 170 to the first interconnecting circuitry 180.

Figure 7:
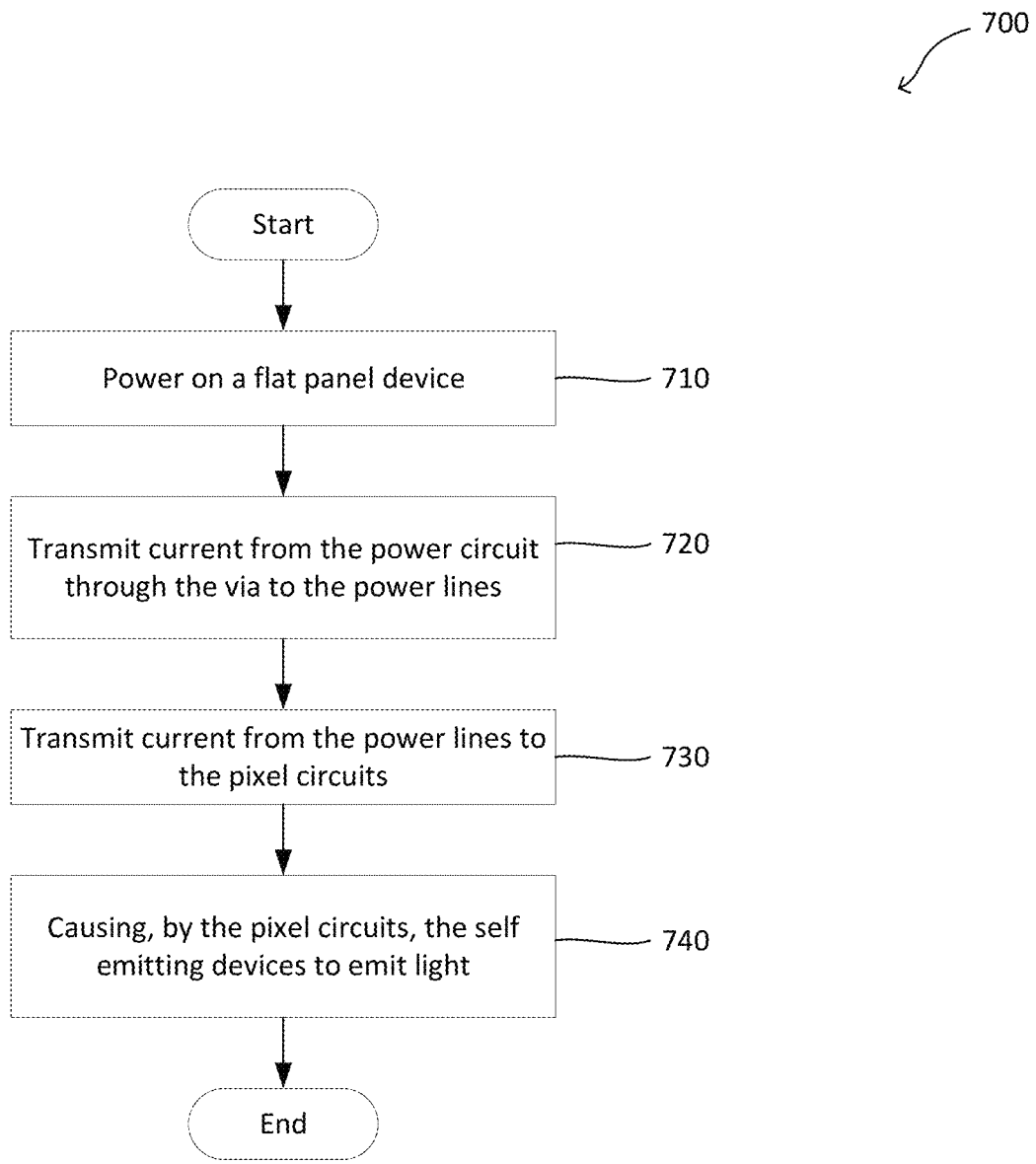
FIG. 7 depicts a flowchart of a method of using a flat panel device.
Figure 8:
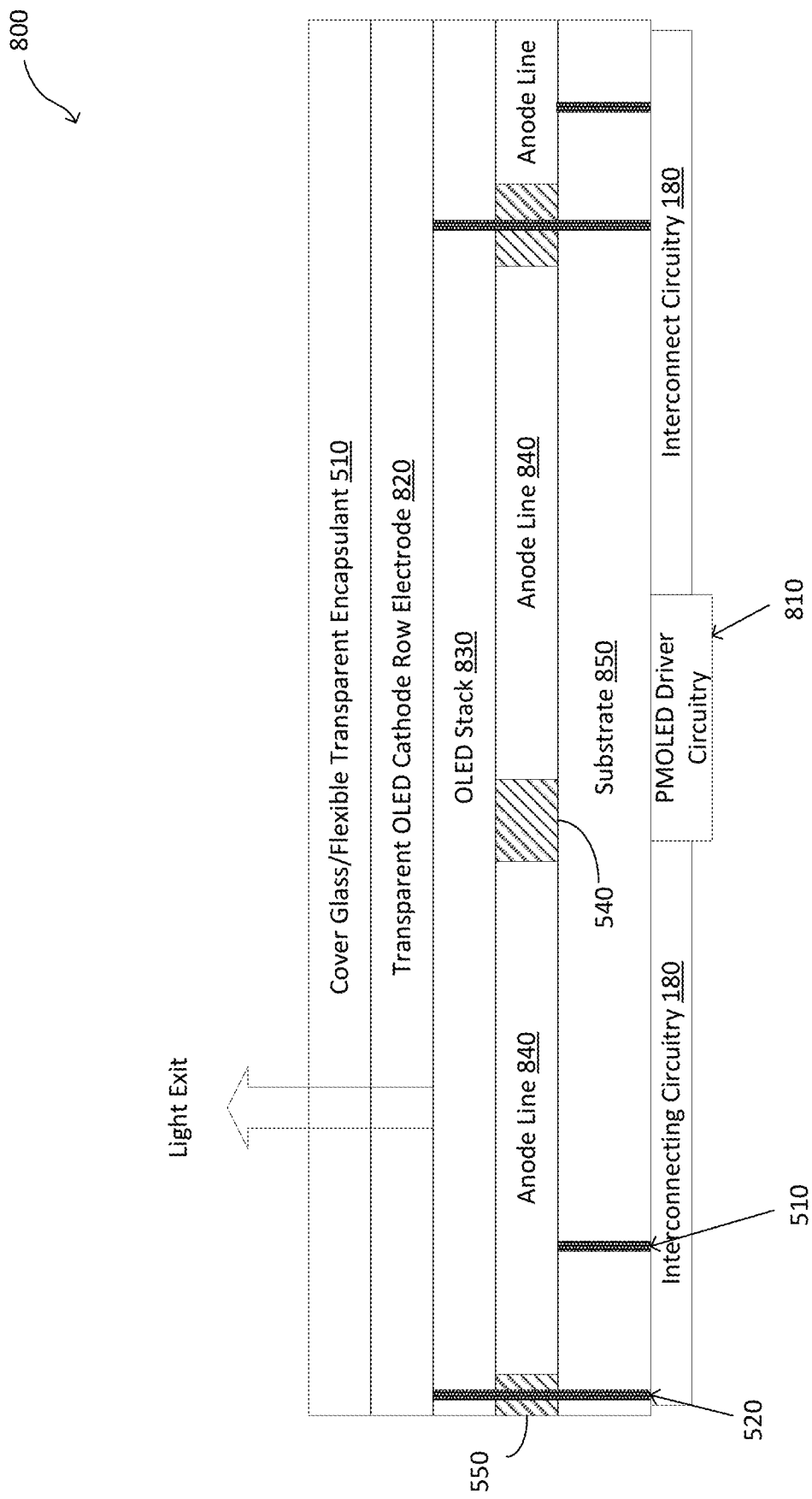
FIG. 8 depicts a cross section of a flat panel device according to an embodiment.

FIG. 7 depicts a flowchart of a method 700 of using a flat panel device, e.g., device 100, 100', 500, or 800 (FIG. 8). The method 700 comprises powering (710) on a flat panel device; transmitting (720) current from the power circuit 170 through the via 160 to the power lines 150; transmitting (730) current from the power lines 150 to the pixel circuits 140; and causing (740), by the pixel circuits 140, the self-emitting devices 130 to emit light.

FIG. 8 depicts a cross section of a flat panel device 800 according to an embodiment. The device 800 is similar to the devices 100, 100' and 500 except that device is passive matrix instead of active matrix. The device 800 comprises a substrate 850 with anode lines 840 and non-emitting space 540 and edge 550 disposed on a first surface. A Passive Matrix OLED (PMOLED) driver circuitry 810 be disposed on or behind a second surface of the substrate 850. The circuitry 850 is electrically coupled to the anode lines 840 and to an OLED stack 830 through interconnecting circuitry 180, which is connected to the vias 510 and 520. Disposed over the OLED stack 830 is a transparent OLED cathode row electrode 820, which is in turn covered by the encapsulant 510.

Accordingly, device 800 does not have a TFT array on the substrate. The OLED stack 830 can be continuous or patterned and/or a single color (e.g., white). However, the lit area is where the anode lines 840 are connected. In an embodiment, the entire anode structure is actually an active area where OLED stack 830 will light up. This area is connected to the anode line 840 by a short conductor that can be a segment of line between the lit area and the anode line 840. In an embodiment, the cathode electrode 820 includes rows of conductors in parallel to the page. Each electrode has one conductive via 520 coupled to it.

In an embodiment, the anode electrodes 840 are columns of conductors perpendicular to the page. Each anode electrode has one conductive via 510 coupled to it. Depending on the type of driver circuitry, the anode and cathode can be switched, i.e., the cathode can be at the bottom and the anode on the top.

Multiple panels can be assembled without visible seam. In an embodiment, placing interconnecting circuitry 180 and driver circuitry 810 under non-emitting areas 540 and 550 can make the device 800 have double sided emission.

The following examples describe various embodiments of methods, machine-readable media, and systems (e.g., machines, devices, or other apparatus) discussed herein.

1. A flat panel device, comprising:
   a substrate;
   a power circuit;
   at least one pixel circuits, at least one of the pixel circuits coupled to a self-emitting device; and
   at least one power line electrically coupled to the at least one pixel circuit, the at least one power line also electrically coupled to the power circuit by at least one via traveling through the substrate.

2. The flat panel device of example 1, wherein the self-emitting device is a white organic light emitting diode.

3. The flat panel device of any of the preceding examples, further comprising a first non-emitting space between each pixel circuit and have an edge non-emitting space with a length less than a length of the first non-emitting space.

4. The flat panel device of any of the preceding examples wherein the power circuit is disposed on a first surface of the array substrate and the plurality of power lines are disposed on a second surface of the array substrate.

5. The flat panel device of any of the preceding examples, further comprising a first plurality of interconnecting circuitry on the first surface electrically coupling the vias to the power circuit.

6. The flat panel device of any of the preceding examples, further comprising a common electrode disposed over the self-emitting devices.

7. The flat panel device of any of the preceding examples, further comprising a cathode electrode and an anode electrode disposed in-plane on the substrate.

8. The flat panel device of any of the preceding examples, wherein the plurality of powers lines are electrically connected to the plurality of pixel circuits through a second plurality of interconnects.

9. The flat panel device of any of the preceding examples, further comprising a plurality of signal lines connected to the pixel circuits via the second plurality of interconnects.

10. The flat panel device of any of the preceding examples, wherein the self-emitting device includes a micro light emitting diode, an organic light emitting diode, a light emitting diode. Red. Green Blue light emitting diodes, quantum dot light emitting diodes, or electroluminescent devices.

11. The flat panel device of any of the preceding examples, wherein the self-emitting device is part of a sheet of organic light emitting diodes.

12. A method of manufacturing the flat panel device of any of the preceding examples, comprising:
   providing the substrate
   placing the pixel circuit on a first surface of the array substrate;
   connecting the pixel circuit to the self-emitting devices;
   laying the power line on the first surface electrically coupled to the pixel circuit;
   creating the via through the substrate electrically coupled to the power line;
   placing a first interconnecting circuitry on a second surface of the substrate electrically coupled to the via; and
   bonding the power circuit to the first interconnecting circuitry.

13. The method of any of the preceding examples, further comprising:
   placing a second interconnect on the first surface; and
   coupling signal lines to the pixel circuits through the second interconnect.

14. The method of any of the preceding examples, wherein the self-emitting device is a white organic light emitting diode 15. The method of any of the preceding examples, further comprising disposing a common electrode over the self-emitting devices.

16. A method, comprising:
   powering on a flat panel device; the flat panel device comprising
   a substrate;
   a power circuit;
   at lease one pixel circuit, the pixel circuit coupled to a self-emitting device; and
   at least one power line electrically coupled to the at least one pixel circuit; the at least one power line also electrically coupled to the power circuit by at least one via traveling through the substrate;
   transmitting current from the power circuit through the via to the power line;
   transmitting current from the power line to the pixel circuit; and
   causing. by the pixel circuit, the self-emitting device to emit light.

17. The method of any of the preceding examples, wherein the self-emitting device is a white organic light emitting diode.

18. The method of any of the preceding examples, wherein the device further comprises a common electrode disposed over the self-emitting device.

19. The method of any of the preceding examples, wherein the device further comprises a common electrode and an anode electrode disposed in-plane on the substrate.

20. The method of any of the preceding examples, wherein the plurality of powers lines are electrically connected to the plurality of pixel circuits through a second plurality of interconnects.

21. A flat panel device, comprising:
   a substrate,
   at least an anode line, and
   at least a cathode line;
   an OLED stack, which is electrically coupled to the at least anode and cathode lines;
   a driver circuitry electrically coupled to the at least an anode line and the at least cathode line through a plurality of vias.

22. The flat panel device of any of the preceding examples, wherein the plurality of vias includes a first set of vias electrically couple the interconnecting circuitry to the anode lines and a second set of vias electrically couple the interconnecting circuitry to the OLED cathode row electrode.

23. The flat panel device of any of the preceding examples, further comprising a plurality of anode lines and non-emitting spaces between anode lines and at an edge of the device, the non-emitting space at the edge having a length less than a length of non-emitting spaces between anode lines.

24. The flat panel device of any of the preceding examples, wherein the direct circuitry is a passive matrix OLED driver with pulse width modulation of driving current.

Although the subject matter has been described with reference to specific example embodiments, it will be evident that various modifications and changes may be made to these embodiments without departing from the broader scope of the disclosed subject matter. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Description, therefore, is not to be taken in a limiting sense, and the scope of various embodiments is defined only by any appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A flat panel device, comprising:
   A substrate;
   a power circuit;
   at least one pixel circuits, the at least one of the pixel circuits coupled to a self-emitting device; and
   at least one power line electrically coupled to the at least one pixel circuit, the at least one power line also electrically coupled to the power circuit by at least one via traveling through the substrate.

2. The flat panel device of claim 1, wherein the self-emitting device is a white organic light emitting diode.

3. The flat panel device of claim 2, further comprising a first non-emitting space between each pixel circuit and have an edge non-emitting space with a length less than a length of the first non-emitting space.

4. The flat panel device of claim 1, wherein the power circuit is disposed on a first surface of the array substrate and the plurality of power lines are disposed on a second surface of the substrate.

5. The flat panel device of claim 4, further comprising a first plurality of interconnecting circuitry on the first surface electrically coupling the vias to the power circuit.

6. The flat panel device of claim 1, further comprising a common electrode disposed over the self-emitting devices.

7. The flat panel device of claim 1, further comprising a cathode electrode and an anode electrode disposed in-plane on the substrate.

8. The flat panel device of claim 1, wherein the at least one powers line are electrically connected to the plurality of pixel circuits through a second plurality of interconnects.

9. The flat panel device of claim 8, further comprising a plurality of signal lines connected to the pixel circuits via the second plurality of interconnects.

10. The flat panel device of claim 1, wherein the self-emitting device includes a micro light emitting diode, an organic light emitting diode, a light emitting diode, Red, Green Blue light emitting diodes, quantum dot light emitting diodes, or electroluminescent devices.

11. The flat panel device of claim 1, wherein the self-emitting device is part of a sheet of organic light emitting diodes.

12. A method of manufacturing the flat panel device of claim 1, comprising:
   providing the substrate
   placing the pixel circuit on a first surface of the substrate;
   connecting the pixel circuit to the self-emitting devices;
   laying the power line on the first surface of the substrate electrically coupled to the pixel circuit;
   creating the via through the substrate electrically coupled to the power line;
   placing a first interconnecting circuitry on a second surface of the substrate electrically coupled to the via; and
   bonding the power circuit to the first interconnecting circuitry.

13. The method of claim 12, further comprising:
   placing a second interconnect on the first surface of the substrate; and
   coupling a plurality of signal lines to the pixel circuits through the second interconnect.

14. The method of claim 12, wherein the self-emitting device is a white organic light emitting diode.

15. The method of claim 12, further comprising disposing a common electrode over the self-emitting devices.

16. A method, comprising:
   powering on a flat panel device; the flat panel device comprising
   a substrate;
   a power circuit;
   at least one pixel circuit, the at least one pixel circuit coupled to a self-emitting device; and
   at least one power line electrically coupled to the at least one pixel circuit; the at least one power line also electrically coupled to the power circuit by at least one via traveling through the substrate;
   transmitting current from the power circuit through the via to the power line;
   transmitting current from the power line to the pixel circuit; and
   causing, by the pixel circuit, the self-emitting device to emit light.

17. The method of claim 16, wherein the self-emitting device is a white organic light emitting diode.

18. The method of claim 16, wherein the device further comprises a common electrode disposed over the self-emitting device.

19. The method of claim 16, wherein the device further comprises a common electrode and an anode electrode disposed in-plane on the substrate.

20. The method of claim 16, wherein the plurality of powers lines are electrically connected to the plurality of pixel circuits through a second plurality of interconnects.

* * * * *